United States Patent
Laske et al.

(10) Patent No.: US 9,892,885 B2
(45) Date of Patent: Feb. 13, 2018

(54) SYSTEM AND METHOD FOR DRIFT COMPENSATION ON AN ELECTRON BEAM BASED CHARACTERIZATION TOOL

(71) Applicant: KLA-Tencor Corporation, Milpitas, CA (US)

(72) Inventors: Frank Laske, Weilburg (DE); Christopher Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/269,031

(22) Filed: Sep. 19, 2016

(65) Prior Publication Data

US 2017/0278666 A1 Sep. 28, 2017

Related U.S. Application Data

(60) Provisional application No. 62/312,651, filed on Mar. 24, 2016.

(51) Int. Cl.
 *G03F 7/20* (2006.01)
 *G03F 1/84* (2012.01)
 (Continued)

(52) U.S. Cl.
 CPC ............ *H01J 37/10* (2013.01); *H01J 37/20* (2013.01); *H01J 37/244* (2013.01); *H01J 37/28* (2013.01); *H01J 2237/1501* (2013.01)

(58) Field of Classification Search
 CPC ...... B82Y 10/00; B82Y 40/00; H01J 37/3045; H01J 37/28; H01J 37/3174; H01J 37/3177;
 (Continued)

(56) References Cited

U.S. PATENT DOCUMENTS 4,785,187 A * 11/1988 Kariya .................. B82Y 10/00
                                                 250/491.1
5,424,548 A *  6/1995 Puisto .................. H01J 37/304
                                                 250/491.1

(Continued)

FOREIGN PATENT DOCUMENTS

EP           1202320 A2    5/2002

*Primary Examiner* — David A Vanore
(74) *Attorney, Agent, or Firm* — Suiter Swantz pc llo (57) ABSTRACT

A scanning electron microscopy system includes an electron beam source, a sample stage that includes a first alignment feature, an electron-optical column that includes electron-optical elements that include a lens having a second alignment feature, and an alignment plate having a third alignment feature. The system additionally includes a reference target, and a detector assembly. The electron-optical elements configurable to simultaneously focus on a substrate and the reference target. The system also includes a controller communicatively coupled to at least one or more portions of the electron-optical column and the sample stage, to make adjustments in order to align the electron beam to at least one of the first set of alignment features, the second set of alignment features, the third set of alignment features, the reference target or the substrate. The controller also makes adjustments to simultaneously focus the electron beam at a first and second high resolution plane.

22 Claims, 8 Drawing Sheets

(51) Int. Cl.
    *H01J 37/10*     (2006.01)
    *H01J 37/28*     (2006.01)
    *H01J 37/20*     (2006.01)
    *H01J 37/244*    (2006.01)

(58) Field of Classification Search
    CPC ...... H01J 37/304; G03F 1/84; G03F 7/70466;
                              G03F 7/70491; G03F 9/7053
    USPC .......... 250/491.1, 492.2, 492.22, 252.1, 310,
                              250/336.1, 395, 396 R, 398
    See application file for complete search history.

(56)         References Cited

U.S. PATENT DOCUMENTS

| | | | |
|---|---|---|---|
| 6,538,248 B1* | 3/2003 | Kametani | H01J 37/28 |
| | | | 250/310 |
| 9,424,636 B2* | 8/2016 | Laske | G06T 7/001 |
| 2006/0145097 A1* | 7/2006 | Parker | B82Y 10/00 |
| | | | 250/492.22 |
| 2009/0121134 A1 | 5/2009 | Oosaki et al. | |
| 2010/0270468 A1 | 10/2010 | Liu et al. | |
| 2010/0282956 A1* | 11/2010 | Kimba | H01J 37/28 |
| | | | 250/252.1 |
| 2013/0168569 A1* | 7/2013 | Yamaguchi | B82Y 40/00 |
| | | | 250/395 |
| 2014/0209818 A1* | 7/2014 | Oishi | G03F 7/70466 |
| | | | 250/492.22 |
| 2015/0109598 A1 | 4/2015 | Vergeer | |
| 2015/0243471 A1 | 8/2015 | Hooghan | |

* cited by examiner

SYSTEM AND METHOD FOR DRIFT COMPENSATION ON AN ELECTRON BEAM BASED CHARACTERIZATION TOOL

CROSS-REFERENCE TO RELATED APPLICATION

The present application claims priority under 35 U.S.C. § 119(e) to U.S. Provisional Patent Application Ser. No. 62/312,651 entitled DRIFT COMPENSATION ON AN EBEAM BASED METROLOGY TOOL, filed Mar. 24, 2016, naming Frank Laske and Christopher Sears as inventors is an application of which application(s) are entitled to the benefit of the filing date. The above application is incorporated herein by reference in the entirety.

TECHNICAL FIELD

The present invention generally relates to scanning electron microscopy, and, in particular, electron beam drift compensation in a scanning electron microscopy system.

BACKGROUND

The fabrication of semiconductor devices, such as logic and memory devices, typically includes processing a substrate such as a semiconductor wafer using a large number of semiconductor fabrication processes to form various features and multiple levels of the semiconductor devices. As semiconductor device size becomes smaller and smaller, it becomes critical to develop enhanced inspection and metrology devices and procedures.

One such technology includes electron beam based inspection and metrology systems, such as, scanning electron microscopy (SEM). In one mode, SEM systems may image a surface of a sample through the collection and analysis of secondary electrons emitted from the surface of the sample as a primary beam is scanned across the sample. Typical SEM systems experience error in surface measurements over time as drift behavior occurs inside and outside of the characterization tool. Therefore, it would be advantageous to provide a system and method that provides correction of these measurement errors caused by drift.

SUMMARY

A scanning electron microscopy system configured to compensate for drift in an electron beam based characterization tool is disclosed, in accordance with one or more embodiments of the present disclosure. In one embodiment, the scanning electron microscopy system includes an electron beam source configured to generate one or more electron beams. In one embodiment, the scanning electron microscopy system includes a sample stage configured to secure a substrate, wherein the sample stage further includes a first alignment feature. In another embodiment, the scanning electron microscopy system includes an electron-optical column. In another embodiment, the electron-optical elements include a set of electron-optical elements. In another embodiment the set of electron-optical elements include an electron-optical lens and an alignment plate mounted to the bottom portion of the electron-optical lens. In another embodiment the electron-optical lens includes a second alignment feature. In another embodiment, the alignment plate includes a third alignment feature. In another embodiment, the scanning electron microscopy system includes a detector assembly. In another embodiment, the scanning electron microscopy system includes a controller communicatively coupled to at least one of the one or more portions of the electron-optical column or the sample stage, wherein the controller is configured to adjust at least one of the one or more portions of the electron-optical column or the sample stage in order to align the one or more electron beams to at least one of the first set of alignment features, the second set of alignment features or the third set of alignment features.

A scanning electron microscopy system configured to compensate for drift in an electron beam based characterization tool is disclosed, in accordance with one or more embodiments of the present disclosure. In one embodiment, the scanning electron microscopy system includes an electron beam source configured to generate one or more electron beams. In one embodiment, the scanning electron microscopy system includes a sample stage configured to secure a substrate. In another embodiment, the sample stage is configured to adjust position to focus the electron beam on the substrate. In another embodiment, the scanning electron microscopy system includes a reference target. In another embodiment, the scanning electron microscopy system includes an electron-optical column. In another embodiment, the electron-optical column includes a set of electron-optical elements. In another embodiment, the set of electron-optical elements include an electron-optical lens. In another embodiment, the set of electron-optical elements can be configured to simultaneously focus on the reference target and the sample. In another embodiment, the scanning electron microscopy system includes a detector assembly. In another embodiment, the scanning electron microscopy system includes a controller communicatively coupled to at least one of the one or more portions of the electron-optical column or the sample stage, wherein the controller is configured to adjust at least one of the one or more portions of the electron-optical column or the sample stage in order to align the one or more electron beams to at least one of the reference target, the substrate or simultaneously to focus on the reference target and substrate.

A method of electron beam drift compensation is disclosed, in accordance with one or more embodiments of the present disclosure. In one embodiment, the method includes securing a substrate on a sample stage; aligning an electron-optical column and sample stage. In another embodiment, the method includes synchronizing the electron-optical column to a stage interferometer system. In another embodiment, the method includes aligning one or more electron beams with one or more alignment features.

A method of electron beam drift compensation is disclosed, in accordance with one or more embodiments of the present disclosure. In one embodiment, the method includes securing a substrate on a sample stage. In another embodiment, the method includes aligning an electron-optical column and sample stage. In another embodiment, the method includes synchronizing the electron-optical column to a stage interferometer system. In another embodiment, the method includes focusing the electron beam on the substrate and the reference target simultaneously.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1 through 7 a system and method for drift compensation on an electron beam based characterization tool is described in accordance with the present disclosure.

Embodiments of the present disclosure are directed to drift compensation on an electron beam based characterization tool and the separation of the drift components that occur inside and outside of the characterization tool. For example, alignment marks located in the electron-optical column, near the inspection area of a substrate and on a plate mounted to the bottom portion of the electron-optical column allow for compensation of drift. In addition, the sets of alignment marks may also allow for the separation of drift that occurs in the electron beam and the interferometer system beam paths.

Figure 1:
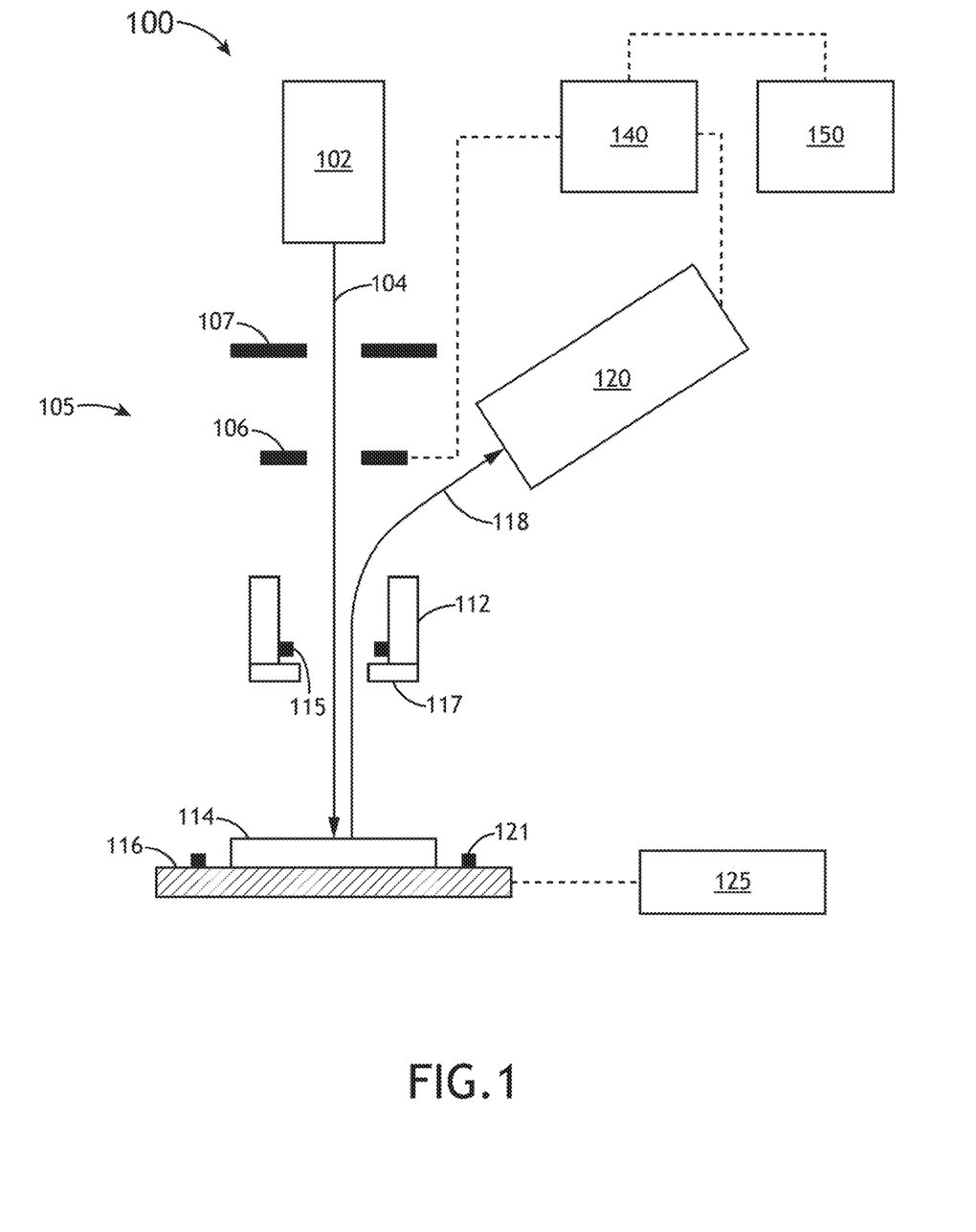
FIG. 1 is a block diagram illustrating a scanning electron microscopy system for drift compensation, in accordance with one or more embodiments of the present disclosure.

FIG. 1 illustrates a block diagram view of system 100 for drift compensation on an electron beam based characterization tool, in accordance with one embodiment of the present disclosure.

In one embodiment, the characterization tool includes an electron source 102, an electron-optical column 105 containing one or more electron-optical elements, a sample stage 116, an interferometer system 125, a detector assembly 120, and/or a controller 140. In another embodiment, a first set of alignment marks 121 are located on the sample stage 116, a second set of alignment marks 115 are located in the electron-optical column 105, and a third set of alignment marks 118 are located on an alignment plate 117 mounted to the bottom portion of the electron-optical column 105. In another embodiment, the electron-optical elements of the electron-optical column 105 act to align the electron beam 104 with the alignment marks to compensate for drift that occurs in the electron beam 104 and/or the stage 116 (measurable by the interferometer system 125).

In one embodiment, the electron source 102 of the characterization system 100 includes one or more electron guns for generating one or more electron beams 104. For example, the one or more electron guns may include a single electron gun. By way of another example, the one or more electron guns may include multiple electron guns. In one embodiment, the electron source 102 and the electron-optical column 105 are configured to impinge the one or more electron beams 104 onto the surface of the substrate 114.

In another embodiment, the electron-optical column 105 of the characterization tool 100 includes a set of electron-optical elements. The set of electron-optical elements may direct at least a portion of the electron beam 104 to the surface of the substrate 114. For example, the electron beam 104 may be directed to a semiconductor wafer disposed on the actuatable stage 116. The set of electron-optical elements of the electron-optical column 105 may include any electron-optical elements known in the art suitable for focusing and/or directing the electron beam 104 to the substrate 114. In one embodiment, the set of electron-optical elements includes one or more electron-optical lenses. For example, the electron-optical lenses may include, but are not limited to, one or more condenser lenses 107 for collecting electrons from the electron beam source 102. By way of another example, the electron-optical lenses may include, but are not limited to, one or more objective lenses 112 for focusing the electron beam 104 onto a selected region of the substrate 114.

For purposes of simplicity a single electron-optical column 105 is depicted in FIG. 1. It is noted herein that this configuration should not be interpreted as a limitation on the present disclosure. For example, the system 100 may include multiple electron-optical columns.

In another embodiment, the set of electron-optical elements of the electron-optical column 105 includes one or more electron beam scanning elements 106. For example, the one or more electron beam scanning elements may include, but are not limited to, one or more electromagnetic scanning coils or electrostatic deflectors suitable for controlling a position of the beam 104 relative to the surface of the substrate 114. In this regard, the one or more scanning elements may be utilized to scan the electron beam 104 across the surface of the substrate 114.

In one embodiment, a sample stage 116 of the characterization system 100 secures a substrate 114. For example, the substrate 114 may be, but does not have to be, one or more wafers (e.g., one or more semiconductor wafers). In another embodiment, the sample stage 116 is an actuatable stage. For example, the sample stage 116 may include, but is not limited to, one or more translational stages suitable for selectably translating the substrate 114 along one or more linear directions (e.g., x-direction, y-direction and/or z-direction) relative to the electron beam 104. By way of another example, the sample stage 116 may include, but is not limited to, one or more rotational stages suitable for selectably rotating the substrate 114 along a rotational direction. By way of another example, the sample stage 116 may include, but is not limited to, a rotational stage and a translational stage suitable for selectably translating the substrate 114 along a linear direction and/or rotating the substrate 114 along a rotational direction. In another embodiment, the system 100 includes an interferometer system 125. In one embodiment, the interferometer system 125 tracks sample stage displacement in the x-direction and y-direction.

In this regard, the stage 116 may act to translate the substrate 114 relative to the electron beam 104. It is noted herein that the system 100 may operate in any scanning or spot detection mode known in the art. For example, the system 100 may operate in a "swathing" or "rastering" (i.e., "step and settle") mode when scanning an electron beam 104 across the surface of the substrate 114. In this regard, the system 100 may scan an electron beam 104 across the surface of the substrate 114, while the sample is moving, with the direction of scanning being nominally perpendicular to the direction of the sample motion. By way of another example, the system 100 may operate in a step-and-scan mode when scanning an electron beam 104 across the surface of the substrate 114.

In one embodiment, the interferometer system 125 of the characterization system 100 tracks the motion of the sample stage 116. In one embodiment, the interferometer system 125 generates a measurement laser beam to track linear displacement of the sample stage 116. For example, the interferometer system 125 may generate two measurement beams to track displacement of the sample stage 116 in the x-direction and y-direction. In one embodiment, the electron-optical column 105 is synchronized with the interferometer system.

In another embodiment, a first set of alignment marks 121 are located on the sample stage 116. In one embodiment, this first set of alignment marks 121 are positioned to be near the inspection area of the substrate 114. For example, the first set of alignment marks 121 could be individual marks located near the corners of the substrate 114. In another embodiment, a second set of alignment marks 115 are located in the electron-optical column 105. For example, the second set of alignment marks 115 could be located on one of the electron-optical lens 112. For instance, the second set of alignment marks 115 could be located on an electron-optical lens 112 that was the final objective lens of the electron-optical column 105. In another embodiment, the second set of alignment marks 115 are disposed about an aperture of the final objective lens. In another embodiment, a third set of alignment marks 118 are located on an alignment plate 117 mounted to the bottom portion of the electron-optical column 105. For example, the third set of alignment marks 118 could be located on an alignment plate 117 mounted to the bottom portion of the final objective of the electron-optical column 105. In one embodiment, the alignment plate 117 is a disc with a hole in the middle through which the electron beam 104 propagates. For example, the alignment plate 117 may be a ring which upon the upper portion includes a grid pattern. For instance, the third set of alignment marks 118 are a special grid pattern located on the top surface of an alignment plate 117 ring. In another embodiment, the alignment plate 117 is a grating.

In another embodiment, the detector assembly 120 of the characterization system 100 detects electrons emanating from the substrate. It is noted that that the detector assembly 120 may include any type of electron detector known in the art. For example, the detector assembly 120 may be a secondary electron detector or a backscattered electron detector. In one embodiment, electrons emanating from the substrate 114 may be collected and imaged using an Everhart-Thornley detector (or other type of scintillator-based detector). In another embodiment, electrons may be collected and imaged using a micro-channel plate (MCP). In another embodiment, electrons may be collected and imaged using a PIN or p-n junction detector, such as a diode or a diode array. In another embodiment, electrons may be collected and imaged using one or more avalanche photo diodes (APDs).

In another embodiment, a controller 140 of the characterization system 100 aligns the electron beam. For example, the controller 140 is communicatively coupled to the output of the one or more detectors in the detector assembly 120 and one or more elements in the electron-optical column. In one embodiment, the controller 140 includes one or more processors (not shown) configured to execute program instructions suitable for causing the one or more processors to execute one or more data processing steps described in the present disclosure. In one embodiment, the one or more processors of the controller 140 may be in communication with a carrier medium (e.g., non-transitory storage medium (i.e., memory medium)) containing the program instructions configured to cause the one or more processors of the controller 140 to carry out various steps described through the present disclosure. It should be recognized that the various processing steps described throughout the present disclosure may be carried out by a single computing system or, alternatively, a multiple computing system. The controller 140 may include, but is not limited to, a personal computer system, mainframe computer system, workstation, image computer, parallel processor, or any other device known in the art. In general, the term "computer system" may be broadly defined to encompass any device having one or more processors, which execute instructions from a memory medium. Moreover, different subsystems of the system 100 may include a computer system or logic elements suitable for carrying out at least a portion of the steps described above. Therefore, the above description should not be interpreted as a limitation on the present disclosure but merely an illustration.

In one embodiment, the one or more processors of the controller 140 may receive data associated with the alignment of the electron beam 104 from the detector assembly 120. In turn, the one or more processors of the controller 140 may execute a set of program instructions to analyze the alignment of the electron beam 104 and adjust the location onto which the electron beam 104 is focused on the substrate 114.

It is further noted herein that a sample stage 116 with a first set of alignment marks 121, an electron-optical lens 112 with a second set of alignment marks 115, and an alignment plate 117 with a third set of alignment marks 118 may be inserted to a pre-existing electron beam inspection or metrology tool. In this regard, pre-existing electron beam inspection or metrology tools may be augmented with the ability to compensate for drift as provided by the first set of alignment marks 121, second set of alignment marks 115, and third set of alignment marks 118.

Figure 2A:
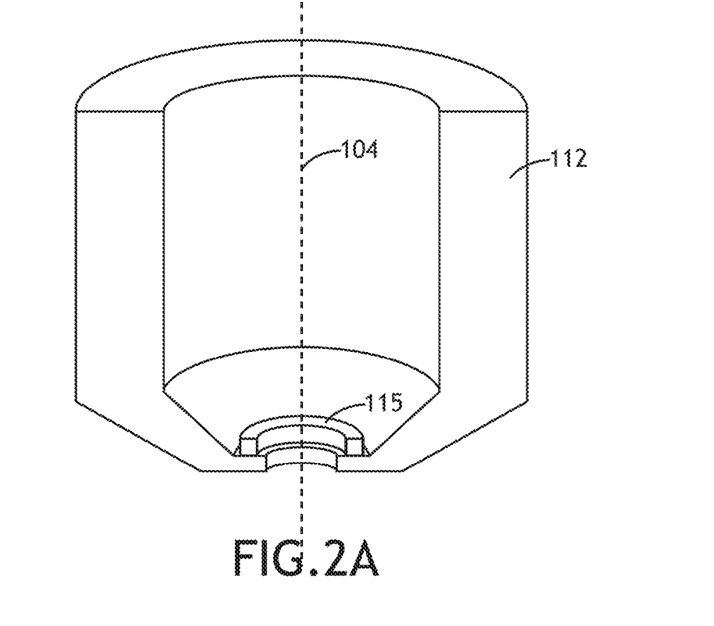
FIG. 2A is a cross-sectional view illustrating an electron-optical lens, in accordance with one or more embodiments of the present disclosure.

FIG. 2A is a cross-sectional view of the electron-optical lens 112 illustrating the second set of alignment marks 115, in accordance with one embodiment of the present disclosure. In one embodiment, the second set of alignment marks 115 is disposed on or about the top surface of a cylindrical ring. For example, the second set of alignment marks 115 may be the top portion of the cylindrical ring itself. By way of another example, the second set of alignment marks 115 may include one or more geometric features disposed on the top portion of the cylindrical ring. By way of another example, the second set of alignment marks 115 may include one or more notches or indentations on the top portion of the cylindrical ring. In this regard, the electron beam 104 passes through the second set of alignment marks 115 as the electron beam propagates toward the substrate 114.

Figure 2B:
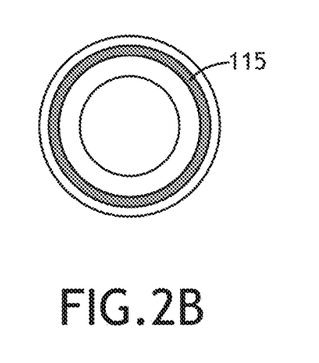
FIG. 2B is a top view illustrating a second set of alignment marks, in accordance with one or more embodiments of the present disclosure.

FIG. 2B is a top view of the electron-optical lens 112 illustrating the second set of alignment marks 115 located at the aperture level of the electron-optical lens 112 through which the electron beam 104 propagates, in accordance with one embodiment of the present disclosure. In one embodiment, the second set of alignment marks 115 include a cylindrical ring that rests upon an aperture in the electron-optical column.

Figure 3:
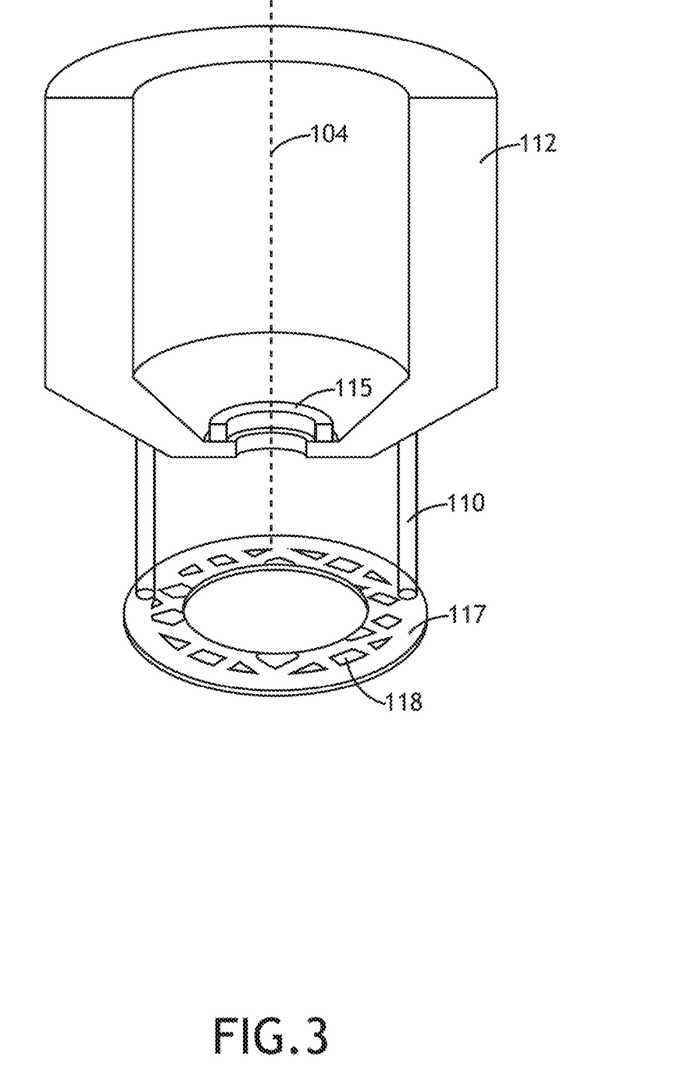
FIG. 3 is a simplified schematic view illustrating the electron-optical lens and the alignment plate including a third set of alignment marks, in accordance with one or more embodiments of the present disclosure.

FIG. 3 is a cross-sectional view of the electron-optical lens 112, second set of alignment marks 115, alignment plate 117, third set of alignment marks 118 and mounting supports 110, in accordance with one embodiment of the present disclosure. In one embodiment, the mounting supports 110 secure the alignment plate 117 to the bottom portion of the electron-optical lens 112. In another embodiment, the electron-optical lens 112 and the alignment plate surround the propagating electron beam 104. In another embodiment, the electron beam 104 passed through the second set of alignment marks 115 and the third set of alignment marks 118 as the electron beam propagates toward the substrate 114.

Figure 4A:
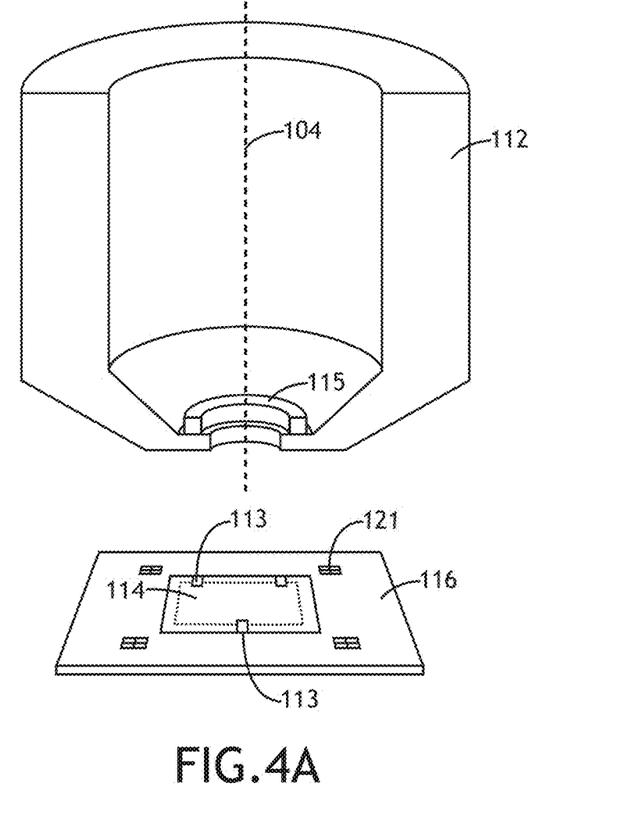
FIG. 4A is a simplified schematic view illustrating the electron-optical lens with a substrate mounted on the sample stage, in accordance with one or more embodiments of the present disclosure.
Figure 4B:
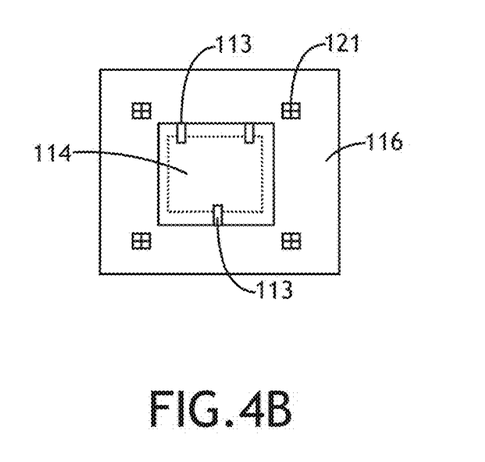
FIG. 4B is a top view of the sample stage illustrating a first set of alignment marks, in accordance with one or more embodiments of the present disclosure.

FIG. 4A is a simplified schematic view of the electron-optical lens 112 and an isometric view of the sample stage 116 illustrating a substrate 114 mounted to the sample stage 116, in accordance with one or more embodiments of the present disclosure. FIG. 4B illustrates a top view of the sample stage 116, in accordance with one or more embodiments of the present disclosure. In one embodiment, supporting structures 113 are located in the sample stage 116 to help secure the substrate 114 to the sample stage 116. In another embodiment, a first set of alignment marks 121 are located on the sample stage 116 near the inspection area of the substrate 114.

Figure 5A:
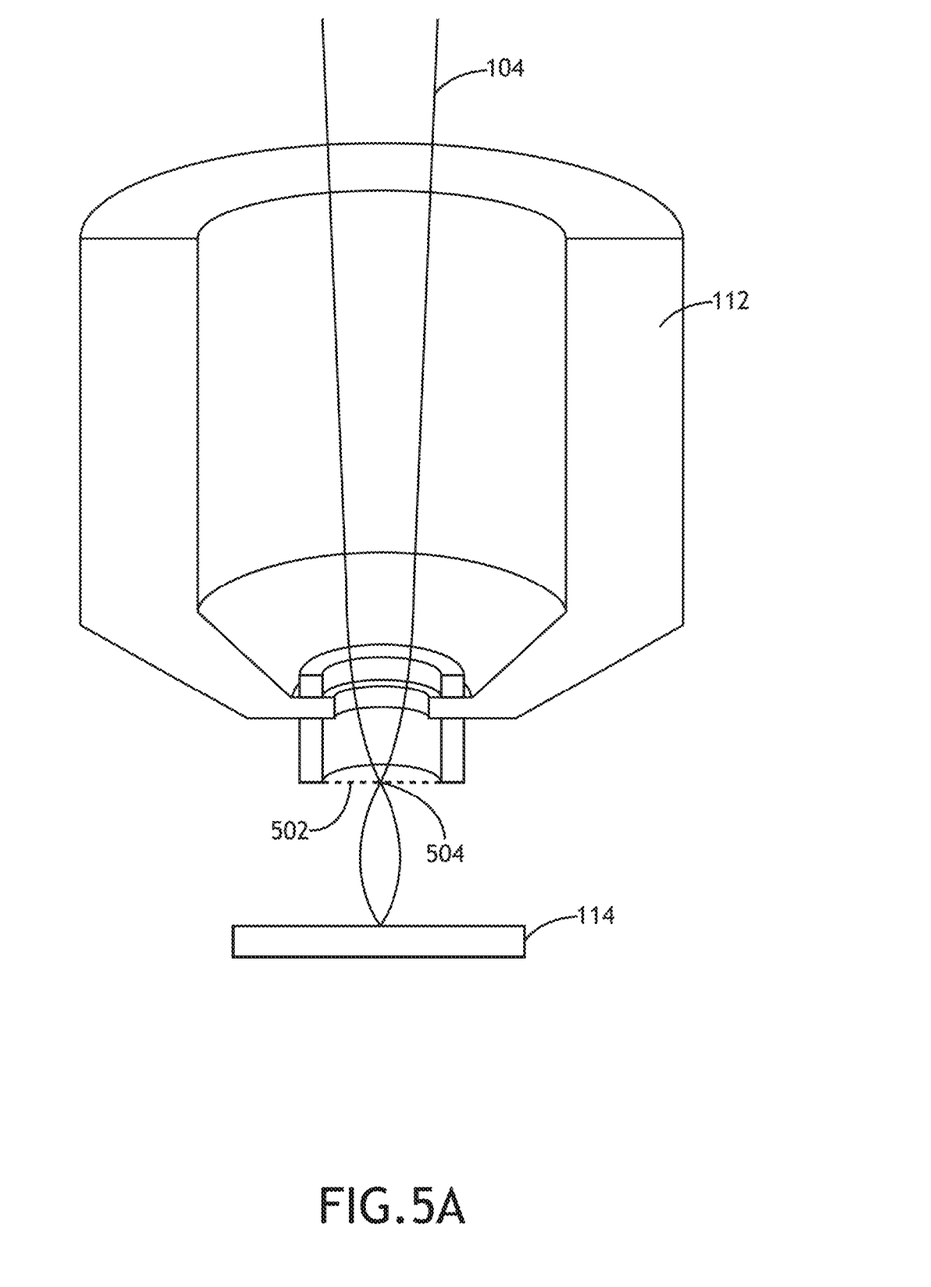
FIG. 5A is a cross-sectional view of the electron-optical lens equipped with a reference target, in accordance with one or more embodiments of the present disclosure.

FIG. 5A is a cross-sectional view of the electron-optical lens 112, reference target 502 and sample 114 illustrating a double focus configuration of the electron beam 104, according to one embodiment of the present disclosure. In one embodiment, an electron beam 104 is focused on the sample 114. In another embodiment, the height of the sample stage 116 is adjusted to focus the electron beam on the sample 114. In another embodiment, an electron beam is focused on a reference target 502. In another embodiment, an electron beam 104 is configured to produce a double focus, whereby the electron beam 104 has an intermediate focus 504 and a final focus which results in two high resolution planes. For example, the electron beam 104 may be simultaneously focused on a sample 114 and a reference target 502. For instance, the electron-optical lens 112 currents and voltages are adjusted to place the reference target in focus at one plane and the sample 114 in focus at another plane. It is noted herein that the electric fields at the reference target are kept small to avoid aberrations. In some embodiments, the final scanning electron microscope image is a combination of both reference and sample. In some embodiments, the final scanning electron microscope image is self-referencing to image drift. In some embodiments, the final scanning electron microscope image is self-referencing to image jitter. It is noted herein that this double focus configuration of the electron beam 104 will account for positioning in the horizontal plane of the sample and reference target. It is noted herein that drift in beam tilt may result in a double focus configuration of the electron beam 104 that would be indicated by a lateral shift between the reference target 502 and the sample 114. In some embodiments, drift in the beam tilt is accounted for with a sample 114 bias wobble alignment condition.

Figure 5B:
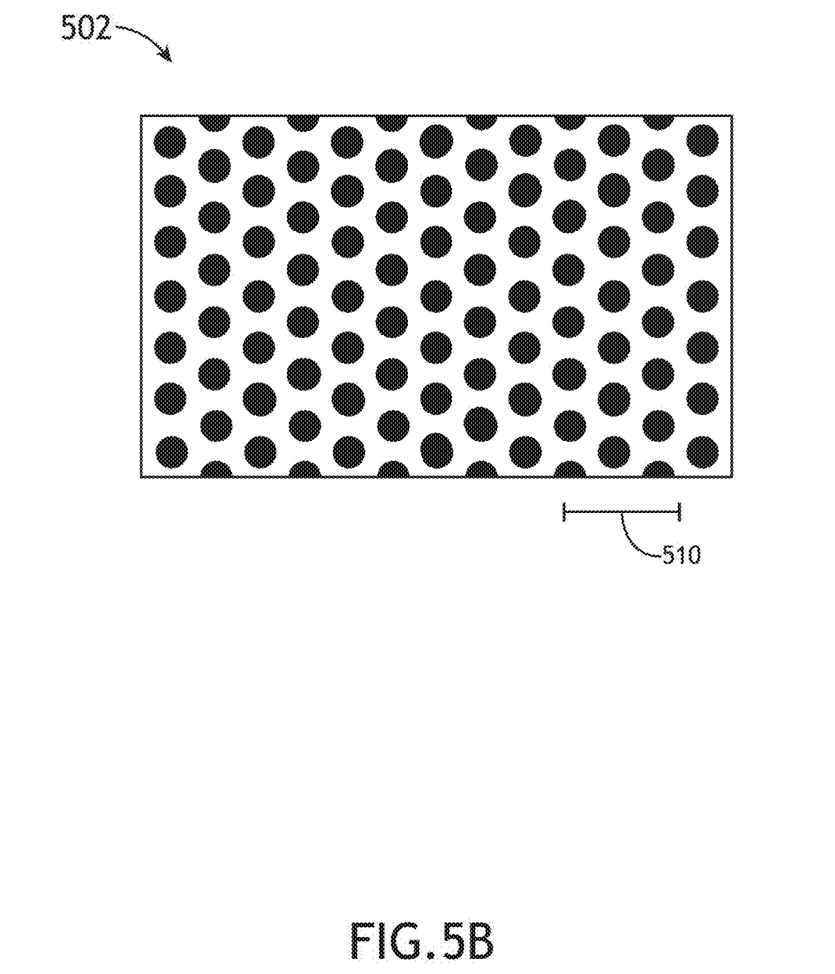
FIG. 5B is a top view of the reference target, in accordance with one or more embodiments of the present disclosure.

FIG. 5B is a top view of the reference target 502 illustrating an SEM image from an intermediate focus 504 of a high resolution plane in a scanning electron microscope, according to one embodiment of the present disclosure. In one embodiment, the reference target 502 is a material with a selected geometric pattern. For example, the reference target 502 may include, but is not limited to, a hexagonal pattern of circular holes. For instance, the view of reference target 502 illustrates an SEM image of a hexagonal pattern of circular holes that has a reference scale indicator of 10 μm 510.

Figure 6:
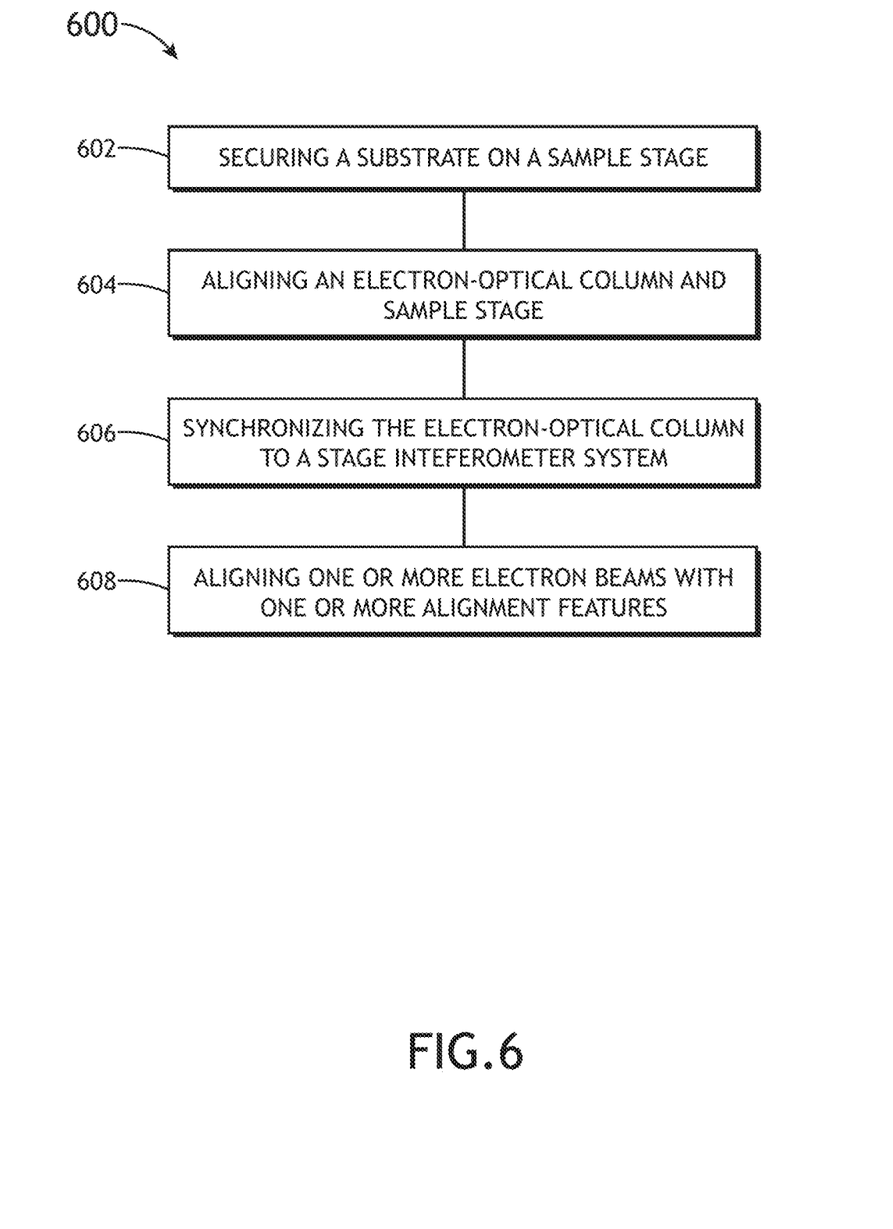
FIG. 6 is a flow diagram illustrating a method for drift compensation of an electron beam based characterization tool, in accordance with one or more embodiments of the present disclosure.
Figure 7:
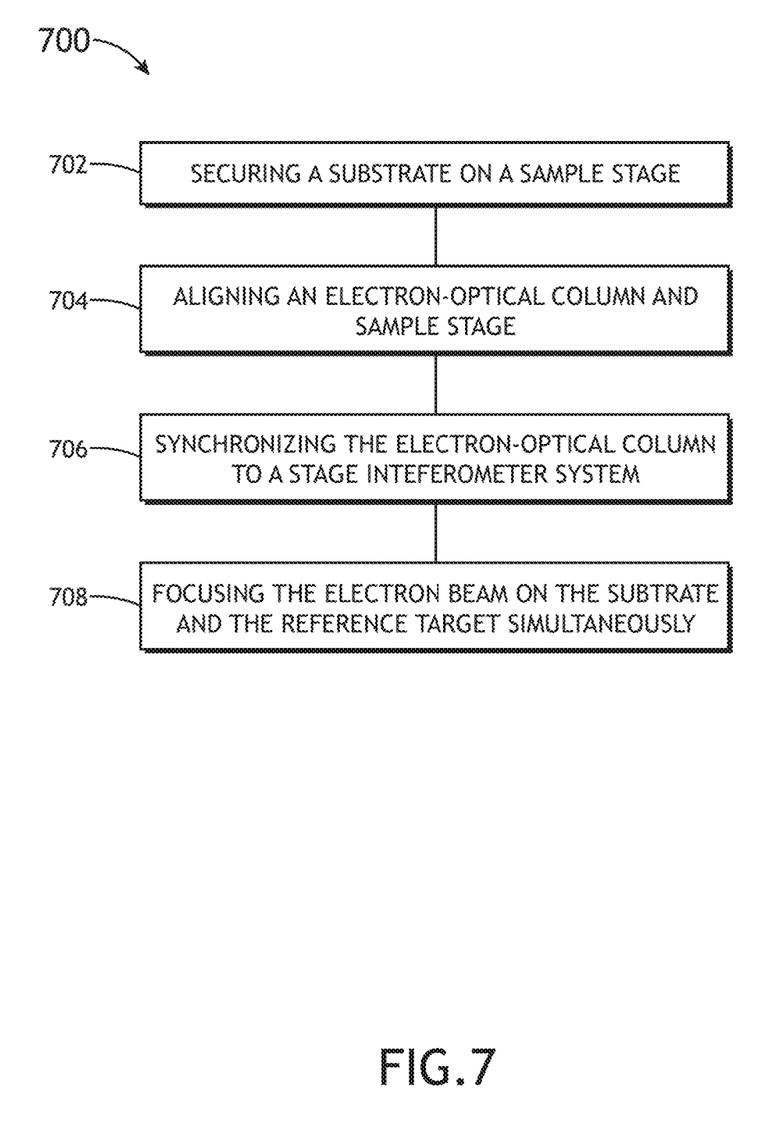
FIG. 7 is a flow diagram illustrating a method for . . . (paragraphs explaining FIG. 7 are missing in the application).

FIG. 6 is a flow diagram that illustrates the steps of a method for drift compensation on an electron beam based characterization tool, in accordance with one or more embodiments of the present disclosure. It is recognized that steps of the process flow 600 may be carried out via system 100. It should, however, be recognized that the system 100 should not be interpreted as a limitation on process 600 as it is contemplated that a variety of system alignment configurations may carry out process flow 600.

Step 602 includes securing a substrate on the sample stage. For example, as shown in FIG. 4, the substrate 114 is placed on the substrate supports 113 located on the sample stage 116.

Step 604 includes aligning the electron-optical column and sample stage. For example, as shown in FIG. 1, the electron source 102 may generate one or more electron beams 104, which is then directed onto the desired location of the substrate 114 via the electron-optical column 105. For instance, as shown in FIG. 1, an electron beam 104 may be aligned to the center portion of the substrate 114.

Step 606 includes synchronizing the electron-optical column 105 to a stage interferometer system 125. For example, as shown in FIG. 1, the electron-optical column 105 aligns the electron beam 104 to the center portion of the substrate 114 at which time the interferometer system 125 is calibrated to record a base position for measuring displacement changes in the sample stage 116.

Step 608 includes aligning one or more electron beams 104 with one or more alignment marks. For example, as shown in FIG. 1, the electron beam 104 may be aligned to the first set of alignment marks 121 or the second set of alignment marks 115. For instance, as shown in FIG. 1, the electron beam 104 may be aligned to the first set of alignment marks 121 located near the inspection area of the substrate 114 located on the sample stage 116.

All of the methods described herein may include storing results of one or more steps of the method embodiments in the memory. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the disclosure is defined by the appended claims.

What is claimed:

1. A scanning electron microscopy system comprising:
    an electron beam source configured to generate one or more electron beams;
    a sample stage configured to secure a substrate, wherein the sample stage includes a first alignment feature;
    an electron-optical column, wherein the electron-optical column includes a set of electron-optical elements, wherein the set of electron-optical elements includes an electron-optical lens and an alignment plate mounted to the bottom portion of the electron-optical lens, wherein the electron-optical lens includes a second alignment feature, wherein the alignment plate includes a third alignment feature;
    a detector assembly; and
    a controller including one or more processors configured to execute a set of program instructions stored in memory, wherein the one or more processors are communicatively coupled to at least one of the one or more portions of the electron-optical column or the sample stage, wherein the one or more processors are configured to adjust at least one of the one or more portions of the electron-optical column or the sample stage in order to align the one or more electron beams to at least one of the first set of alignment features, the second set of alignment features or the third set of alignment features.

2. The scanning electron microscopy system of claim 1, wherein the detector assembly comprises at least one of a secondary electron detector or a backscattered electron detector.

3. The scanning electron microscopy system of claim 1, wherein the electron-optical column includes a set of electron-optical elements.

4. The scanning electron microscopy system of claim 3, wherein the electron-optical elements comprises:
    at least one of a condenser lens, one or more scanning elements, an aperture, or an objective lens.

5. The scanning electron microscopy system of claim 1, wherein the electron-optical lens comprises:
    at least one of an objective or a condenser.

6. The scanning electron microscopy system of claim 5, wherein the objective comprises a final objective.

7. The scanning electron microscopy system of claim 5, wherein the second alignment feature is disposed about an aperture of the objective.

8. The scanning electron microscopy system of claim 1, wherein the first alignment feature is a set of alignment marks located on the sample stage.

9. The scanning electron microscopy system of claim 1, wherein the alignment plate comprises:
at least one of a grid, a grating, a disc or a ring.

10. The scanning electron microscopy system of claim 9, wherein the third alignment feature is a set of alignment marks located on the alignment plate.

11. The scanning electron microscopy system of claim 1, wherein the sample stage comprises:
at least one of a linear sample stage or a rotational sample stage.

12. The scanning electron microscopy system of claim 1, further comprising:
an interferometer system.

13. The scanning electron microscopy system of claim 12, wherein the interferometer system is configured to measure the relative position change of a sample stage and an electron-optical column in at least one of the x-direction, y-direction or z-direction.

14. The scanning electron microscopy system of claim 12, wherein the electron-optical column is synchronized with the interferometer system.

15. A scanning electron microscopy system comprising:
an electron beam source configured to generate one or more electron beams;
a sample stage configured to secure a substrate, wherein the sample stage is configured to adjust position to focus the electron beam on the substrate;
a reference target;
an electron-optical column, wherein the electron-optical column includes a set of electron-optical elements, wherein the set of electron-optical elements includes an electron-optical lens; wherein the set of electron-optical elements can be configured to simultaneously focus on the reference target and the sample;
a detector assembly; and
a controller including one or more processors configured to execute a set of program instructions stored in memory, wherein the one or more processors are communicatively coupled to at least one of the one or more portions of the electron-optical column or the sample stage, wherein the one or more processors are configured to adjust at least one of the one or more portions of the electron-optical column or the sample stage in order to align the one or more electron beams to at least one of the reference target, the substrate or simultaneously to focus on the reference target and substrate.

16. The scanning electron microscopy system of claim 15, wherein focusing the electron-optical elements simultaneously on the reference target and the sample creates a final image that will show evidence of image drift in either plane of focus and image jitter in either plane of focus.

17. A method of electron beam drift compensation comprising:
securing a substrate on a sample stage;
aligning an electron-optical column and sample stage;
synchronizing the electron-optical column to a stage interferometer system; and
aligning one or more electron beams with one or more alignment features,
wherein at least one of the alignment features is disposed about an objective lens.

18. The method of claim 17, aligning one or more electron beams with one or more alignment features:
aligning one or more electron beams with a set of alignment marks located on the sample stage.

19. The method of claim 17, aligning one or more electron beams with one or more alignment features:
aligning one or more electron beams with a set of alignment marks located on an alignment plate.

20. The method of claim 17, further comprising:
performing one or more measurements on the substrate; and
aligning one or more electron beams with at least one of a set of alignment marks located on the sample stage, a set of alignment marks located proximate an objective lens, or a set of alignment marks located on an alignment plate.

21. A method of electron beam drift compensation comprising:
securing a substrate on a sample stage;
aligning an electron-optical column, sample stage, and reference target;
synchronizing the electron-optical column to a stage interferometer system; and
focusing the electron beam on the substrate and the reference target simultaneously.

22. The method of claim 21, further comprising:
performing one or more measurements on the substrate; and
aligning one or more electron beams with at least one of the substrate and reference target.

* * * * *